(12) United States Patent
Law et al.

(10) Patent No.: US 6,825,134 B2
(45) Date of Patent: Nov. 30, 2004

(54) DEPOSITION OF FILM LAYERS BY ALTERNATELY PULSING A PRECURSOR AND HIGH FREQUENCY POWER IN A CONTINUOUS GAS FLOW

(75) Inventors: Kam S. Law, Union City, CA (US); Quanyuan Shang, Saratoga, CA (US); William R. Harshbarger, San Jose, CA (US); Dan Maydan, Los Altos Hills, CA (US); Soo Young Choi, Fremont, CA (US); Beom Soo Park, San Jose, CA (US); Sanjay Yadav, San Jose, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 58 days.

(21) Appl. No.: 10/254,627

(22) Filed: Sep. 24, 2002

(65) Prior Publication Data

US 2003/0186561 A1 Oct. 2, 2003

Related U.S. Application Data

(60) Provisional application No. 60/368,402, filed on Mar. 26, 2002.

(51) Int. Cl.[7] .......................... H01L 21/471; H05H 1/46
(52) U.S. Cl. ...................... 438/788; 427/573; 427/579
(58) Field of Search ................ 438/761, 788; 427/569, 573, 579, 585

(56) References Cited

U.S. PATENT DOCUMENTS

| 4,834,831 | A |   | 5/1989  | Nishizawa et al. ......... 156/611 |
| 5,000,113 | A |   | 3/1991  | Wang et al. ................. 118/723 |
| 5,290,609 | A |   | 3/1994  | Horiike et al. .............. 427/576 |
| 5,294,286 | A |   | 3/1994  | Nishizawa et al. ......... 156/610 |
| 5,347,570 | A |   | 9/1994  | Haaks ....................... 378/98.12 |
| 5,372,860 | A |   | 12/1994 | Fehlner et al. .............. 427/578 |
| 5,469,806 | A |   | 11/1995 | Mochizuki et al. .......... 117/97 |
| 5,480,818 | A |   | 1/1996  | Matsumoto et al. .......... 437/40 |
| 5,503,875 | A |   | 4/1996  | Imai et al. ................ 427/255.3 |
| 5,504,040 | A | * | 4/1996  | Moslehi ...................... 438/761 |

(List continued on next page.)

FOREIGN PATENT DOCUMENTS

| DE | 198 20 147 |    | 7/1999  | ....... H01L/21/3205 |
| EP | 0 299 249  |    | 1/1989  | ........... C23C/16/40 |
| EP | 1 150 345  | A2 | 10/2001 | ......... H01L/21/316 |
| GB | 2 355 727  |    | 5/2001  | ........... C23C/16/44 |
| JP | 58-098917  |    | 6/1983  | ......... H01L/21/205 |
| JP | 62-171999  |    | 7/1987  | ........... C30B/29/40 |
| JP | 63-62313   |    | 3/1988  | ......... H01L/21/203 |
| JP | 1-143221   |    | 6/1989  | ......... H01L/21/314 |
| JP | 1-270593   |    | 10/1989 | ........... C30B/25/02 |
| JP | 2-172895   |    | 7/1990  | ........... C30B/29/36 |

(List continued on next page.)

OTHER PUBLICATIONS

60/352,191.*
J.W. Klaus et al., "Atomic layer deposition of $SiO_2$ using catalyzed and uncatalyzed self–limiting surface reactions," Surface Review and Letters, vol. 6, Nos. 3 & 4 (1999) 435–448.

(List continued on next page.)

Primary Examiner—Carl Whitehead, Jr.
Assistant Examiner—Stephen W. Smoot
(74) Attorney, Agent, or Firm—Moser, Patterson & Sheridan LLP

(57) ABSTRACT

A method of film layer deposition is described. A film layer is deposited using a cyclical deposition process. The cyclical deposition process consists essentially of a continuous flow of one or more process gases and the alternate pulsing of a precursor and energy to form a film on a substrate structure.

33 Claims, 10 Drawing Sheets

U.S. PATENT DOCUMENTS

| | | | |
|---|---|---|---|
| 5,521,126 A | 5/1996 | Okamura et al. | 437/235 |
| 5,527,733 A | 6/1996 | Nishizawa et al. | 437/160 |
| 5,674,304 A | 10/1997 | Fukada et al. | 65/32.4 |
| 5,693,139 A | 12/1997 | Nishizawa et al. | 117/89 |
| 5,796,116 A | 8/1998 | Nakata et al. | 257/66 |
| 5,807,792 A | 9/1998 | Ilg et al. | 438/758 |
| 5,916,365 A | 6/1999 | Sherman | 117/92 |
| 5,923,056 A | 7/1999 | Lee et al. | 257/192 |
| 5,925,574 A | 7/1999 | Aoki et al. | 437/31 |
| 6,025,627 A | 2/2000 | Forbes et al. | 257/321 |
| 6,124,158 A | 9/2000 | Dautartas et al. | 438/216 |
| 6,144,060 A | 11/2000 | Park et al. | 257/310 |
| 6,174,809 B1 | 1/2001 | Kang et al. | 438/682 |
| 6,200,893 B1 | 3/2001 | Sneh | 438/685 |
| 6,203,613 B1 | 3/2001 | Gates et al. | 117/104 |
| 6,207,487 B1 | 3/2001 | Kim et al. | 438/238 |
| 6,232,196 B1 | 5/2001 | Raaijmakers et al. | 438/386 |
| 6,248,686 B1 | 6/2001 | Inagaki et al. | 502/158 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,305,314 B1 | 1/2002 | Sneh et al. | 118/723 R |
| 6,342,277 B1 | 1/2002 | Sherman | 427/562 |
| 6,348,420 B1 | 2/2002 | Raaijmakers et al. | 438/769 |
| 6,352,945 B1 | 3/2002 | Matsuki et al. | 438/778 |
| 6,358,829 B2 | 3/2002 | Yoon et al. | 438/597 |
| 6,383,955 B1 | 5/2002 | Matsuki et al. | 438/790 |
| 6,391,785 B1 | 5/2002 | Satta et al. | 438/704 |
| 6,391,803 B1 | 5/2002 | Kim et al. | 438/787 |
| 6,399,491 B2 | 6/2002 | Jeon et al. | 438/680 |
| 6,410,463 B1 | 6/2002 | Matsuki | 438/790 |
| 6,416,822 B1 * | 7/2002 | Chiang et al. | 427/561 |
| 6,458,718 B1 | 10/2002 | Todd | 438/778 |
| 6,468,924 B2 | 10/2002 | Lee et al. | 438/763 |
| 6,492,283 B2 | 12/2002 | Raaijmakers et al. | 438/770 |
| 6,511,539 B1 | 1/2003 | Raaijmakers et al. | 117/102 |
| 6,534,395 B2 | 3/2003 | Werkhoven et al. | 438/627 |
| 6,544,900 B2 | 4/2003 | Raaijmakers et al. | 438/769 |
| 2001/0000866 A1 | 5/2001 | Sneh et al. | 118/723 R |
| 2001/0002280 A1 | 5/2001 | Sneh | 427/255.25 |
| 2001/0020712 A1 | 9/2001 | Raaijmakers et al. | 257/301 |
| 2001/0024387 A1 | 9/2001 | Raaijmakers et al. | 365/200 |
| 2001/0024871 A1 | 9/2001 | Yagi | 438/604 |
| 2001/0028924 A1 | 10/2001 | Sherman | 427/255.28 |
| 2001/0031562 A1 | 10/2001 | Raaijmakers et al. | 438/770 |
| 2001/0034123 A1 | 10/2001 | Jeon et al. | 438/643 |
| 2001/0041250 A1 | 11/2001 | Werkhoven et al. | 428/212 |
| 2001/0046567 A1 | 11/2001 | Matsuki et al. | 427/578 |
| 2001/0055672 A1 | 12/2001 | Todd | 428/212 |
| 2002/0000598 A1 | 1/2002 | Kang et al. | 257/301 |
| 2002/0016084 A1 | 2/2002 | Todd | 438/791 |
| 2002/0031562 A1 | 3/2002 | Ribnickey et al. | 424/769 |
| 2002/0031618 A1 | 3/2002 | Sherman | 427/569 |
| 2002/0047151 A1 | 4/2002 | Kim et al. | 257/301 |
| 2002/0074588 A1 | 6/2002 | Lee | 257/306 |
| 2002/0076837 A1 | 6/2002 | Hujanen et al. | 438/3 |
| 2002/0093042 A1 | 7/2002 | Oh et al. | 257/303 |
| 2002/0098627 A1 | 7/2002 | Pomarede et al. | 438/149 |
| 2002/0155722 A1 | 10/2002 | Satta et al. | 438/704 |
| 2002/0168868 A1 | 11/2002 | Todd | 438/767 |
| 2002/0173113 A1 | 11/2002 | Todd | 438/398 |
| 2002/0173130 A1 | 11/2002 | Pomerede et al. | 438/592 |
| 2002/0197831 A1 | 12/2002 | Todd et al. | 438/528 |
| 2003/0013320 A1 | 1/2003 | Kim et al. | 438/778 |
| 2003/0015764 A1 | 1/2003 | Raaijmakers et al. | 257/424 |
| 2003/0022528 A1 | 1/2003 | Todd | 438/933 |
| 2003/0032281 A1 | 2/2003 | Werkhoven et al. | 438/640 |
| 2003/0036268 A1 | 2/2003 | Brabant et al. | 438/689 |
| 2003/0049942 A1 | 3/2003 | Haukka et al. | 438/778 |
| 2003/0060057 A1 | 3/2003 | Raaijmakers et al. | 438/770 |
| 2003/0072975 A1 | 4/2003 | Shero et al. | 428/704 |
| 2003/0082300 A1 | 5/2003 | Todd et al. | 427/255.27 |
| 2003/0129826 A1 | 7/2003 | Werkhoven et al. | 438/627 |
| 2003/0143328 A1 * | 7/2003 | Chen et al. | 427/255.28 |
| 2003/0143841 A1 | 7/2003 | Yang et al. | 438/656 |

FOREIGN PATENT DOCUMENTS

| | | | |
|---|---|---|---|
| JP | 3-286522 | 12/1991 | H01L/21/205 |
| JP | 5-047665 | 2/1993 | H01L/21/205 |
| JP | 5-102189 | 4/1993 | H01L/21/336 |
| JP | 5-251339 | 9/1993 | H01L/21/20 |
| JP | 6-196809 | 7/1994 | H01S/3/18 |
| JP | 2001-111000 | 4/2001 | H01L/27/105 |
| JP | 2001-172767 | 6/2001 | C23C/16/40 |
| JP | 2001-189312 | 7/2001 | H01L/21/316 |
| JP | 2002-060944 | 2/2002 | C23C/16/30 |
| WO | 98/20524 | 5/1998 | H01L/21/20 |
| WO | 00 15865 | 3/2000 | C23C/16/44 |
| WO | 00 16377 | 3/2000 | |
| WO | 00 54320 | 9/2000 | H01L/21/44 |
| WO | 01/15220 | 3/2001 | H01L/21/768 |
| WO | 01/17692 | 3/2001 | B05C/11/00 |
| WO | 01/29893 | 4/2001 | H01L/21/768 |
| WO | 01 40541 | 6/2001 | C23C/16/40 |
| WO | 01/41544 | 6/2001 | |
| WO | 01 66832 | 9/2001 | C30B/25/14 |
| WO | 02 43115 | 5/2002 | |
| WO | 02/45167 | 6/2002 | H01L/27/00 |
| WO | 02/45871 | 6/2002 | B05D/3/04 |
| WO | 02 064853 | 8/2002 | C23C/16/00 |
| WO | 02 065508 | 8/2002 | |
| WO | 02 065516 | 8/2002 | H01L/21/00 |
| WO | 02 065517 | 8/2002 | H01L/21/00 |
| WO | 02 065525 | 8/2002 | H01L/21/28 |
| WO | 02/080244 | 10/2002 | H01L/21/205 |
| WO | 02/097864 | 12/2002 | |

OTHER PUBLICATIONS

Yamaguchi, et al., "Atomic–layer chemical–vapor–deposition of silicon dioxide films with an extremely low hydrogen content," Applied Surface Science 130–132 (1998) 202–207.

George, et al., "Surface chemistry for atomic layer growth," J. Phys. Chem. 1996, vol. 100, 13121–13131.

George, et al., "Atomic layer controlled deposition of $SiO_2$ and $Al2O_3$ using ABAB . . . binary reaction sequence chemistry," Applied Surface Science 82/83 (1994) 460–467.

Wise, et al, "Diethyldiethoxysilane as a new precursor for $SiO_2$ growth on silicon," Materials Research Society Symposium Proceedings, vol. 334 (1993), pp. 37–43.

Sakaue, et al., "Digital chemical vapor deposition of $SiO_2$ using a repetitive reaction of thiethylsilane/hydrogen and oxidation," Japanese Journal of Applied Physics, vol. 30, No. 1B., Jan. 1990, pp. L124–L127.

Nakano, et al., "Digital CVD of $SiO_2$," Extended Abstracts of the 21st Conference of Solid State Devices and Materials, Tokyo, 1989, pp. 49–52.

Nakano, et al., "Digital chemical vapor deposition of $SiO_2$," Appl. Phys. Lett. 57(11), Sep. 10, 1990, pp. 1096–1098.

Ritala, et al. "Atomic Layer Deposition of Oxide Thin Films with Metal Alkoxides as Oxygen Sources," Science vol. 288 Apr. 14, 2000, pp. 319–321.

Paranjpe, et al. "Atomic Layer Deposition of $ALO_x$ for Thin Film Head Gap Applications," J. Electrochem. Soc., vol. 148, No. 9, Sep. 2001, pp. G465–G471.

Min, et al. "Meta–organic Atomic–layer Deposition of Titanium–silicon–nitride Films," Applied Physics Letters, vol. 75, No. 11 (Sep. 11, 1999), pp. 1521–1523.

Min, et al. "Chemical Vapor Deposition of Ti–Si–N Films with Alternating Source Supply," Mat. Res. Soc. Symp. Proc. vol. 564 (1999), pp. 207–210.

Lee, et al. "Cyclic Technique for the Enhancement of Highly Oriented Diamond Film Growth," Thin Solid Films 303 (1997) pp. 264–268.

Jeong, et al. "Plasma–assisted Atomic Layer Growth of High–Quality Aluminum Oxide Thin Films," Jpn. J. Appl. Phys. 1, Regul. Pap. Short Notes, vol. 40, No. 1, Jan. 2001, pp. 285–289.

Jeong, et al. "Growth and Characterization of Aluminum Oxide $Al_2O_3$ Thin Films by Plasma–assisted Atomic Layer Controlled Deposition," J. Korean Inst. Met. Mater., vol. 38, No. 10, Oct. 2000, pp: 1395–1399.

Hwang, et al. "Nanometer–Size $\alpha$–$PbO_2$–type $TiO_2$ in Garnet: A Thermobarometer for Ultrahigh–Pressure Metamorphism," Science vol. 288 (Apr. 14, 2000), pp. 321–324.

Elers, et al. "$NbCl_5$ as a Precursor in Atomic Layer Epitaxy," Applied Surface Science 82/83 (1994) 468–474.

Derbyshire, "Applications of Integrated Processing," Solid State Technology, Dec. 1994, pp. 45–49.

Choi, et al. "The Effect of Annealing on Resistivity of Low Pressure Chemical Vapor Deposited Titanium Diboride," J. Appl. Phys. 69(11), Jun. 1, 1991, pp. 7853–7861.

Choi, et al. "Stability of $TiB_2$ as a Diffusion Barrier on Silicon," J. Electrochem, Soc., vol. 138, No. 10, Oct. 1991, pp. 3062–3067.

Bedair, "Atomic Layer Epitaxy Deposition Processes," J. Vac. Sci. Technol. B., vol. 12, No. 1, Jan./Feb. 1994, pp. 179–185.

Argarwal, et al. "Challenges in Integrating the High–K Gate Dielectric Film to the Conventional CMOS Process Flow," Mat. Sec. Soc. Symp. Proc. vol. 670 (2001) Apr.

International Search Report dated Jul. 21, 2003 for PCT/US03/08650.

* cited by examiner

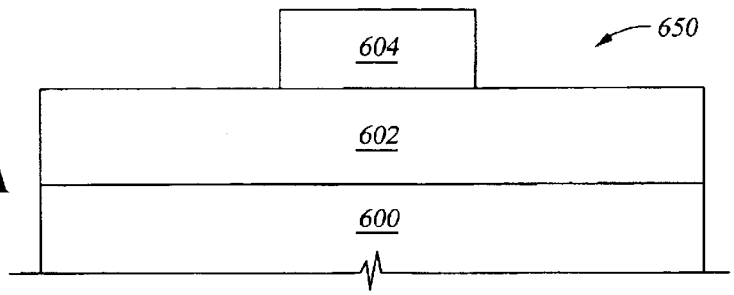
Fig. 10A
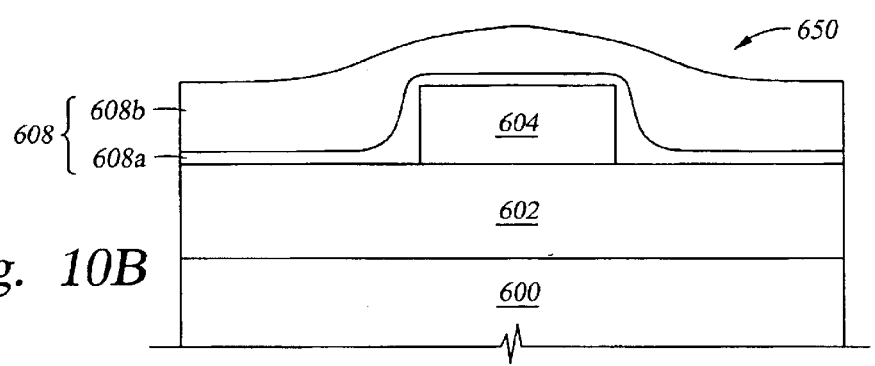
Fig. 10B
Fig. 10C
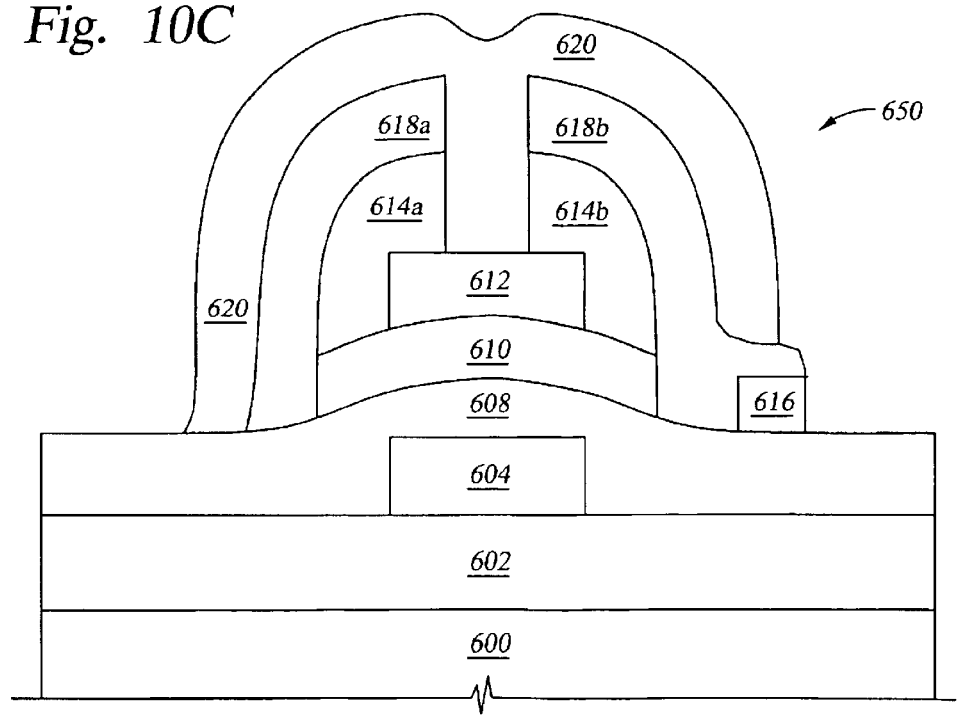

US 6,825,134 B2

DEPOSITION OF FILM LAYERS BY ALTERNATELY PULSING A PRECURSOR AND HIGH FREQUENCY POWER IN A CONTINUOUS GAS FLOW

This application claims priority from U.S. Provisional Application Ser. No. 60/368,402 filed Mar. 26, 2002 entitled, "Deposition Of Gate Dielectric Layers For Active Matrix Liquid Crystal Display (AMLCD) Applications". The foregoing patent application, which is assigned to the assignee of the present application, is incorporated herein by reference in its entirety.

BACKGROUND OF THE INVENTION

Active matrix liquid crystal displays (AMLCD) have eliminated many problems associated with passive displays. For example, the fabrication of active matrix liquid crystal displays have enabled display screens to achieve greater brightness, enhanced readability, a greater variety of color shades, and broader viewing angles compared to displays that employ other technologies. Active matrix liquid crystal displays generally comprise an array of picture elements called pixels. An electronic switch is associated with each pixel in the display to control the operation thereof. Various electronic switches such as, for example, thin film transistors and organic light emitting diodes (OLED), among others have been investigated to control pixel operation. Thin film transistors, in particular, offer a high degree of design flexibility and device performance.

Thin film transistors generally are formed on large area substrates having a high degree of optical transparency such as, for example, glass substrates. FIG. 1 depicts a cross-sectional schematic view of a thin film transistor (TFT) 122 being a type that has a bottom gate structure. The thin film transistor 122 includes a glass substrate 101 having an underlayer 102 formed on the surface thereof. A gate is formed on the underlayer 102. The gate comprises a gate metal layer 104 and a gate dielectric 108. The gate controls the movement of charge carriers in the transistor. The gate dielectric 108 formed over the gate metal layer 104 electrically isolates the gate metal layer 104 from semiconductor layers 110, 114a, 114b, formed thereon, each of which may function to provide charge carriers to the transistor. A source region 118a of the transistor is formed on semiconductor layer 114a and a drain region 118b of the transistor is formed on semiconductor layer 114b. Finally, a passivation layer 120 encapsulates the thin film transistor 122 to protect it from environmental hazards such as moisture and oxygen.

Each layer is critical with respect to the electrical performance of the thin film transistor (TFT). In particular, the gate dielectric layer needs to have certain qualities (e.g., low flatband voltage ($V_{fb}$)) in order for the transistor to have overall desirable electrical parameters, such as, for example, a high breakdown voltage ($V_B$).

Many film layers can be deposited using conventional techniques, such as, for example, plasma assisted chemical vapor deposition (PECVD). Unfortunately, high temperatures are required to deposit film layers using PECVD techniques and high deposition temperatures may not be compatible with some substrates, such as glass substrates, as the glass may soften and become dimensionally unstable.

Therefore, a need exists to develop a method of forming high-quality film layers on temperature-sensitive substrates.

SUMMARY OF THE INVENTION

A method of film deposition is described herein. The film is deposited using a cyclical deposition process. The cyclical deposition process consists essentially of a substantially continuous flow of one or more process gases modulated by alternating periods of pulsing and non-pulsing where the periods of pulsing alternate between pulsing a precursor into the process environment, and pulsing energy into the process environment to generate a plasma. Thus, the methods consist essentially of placing a substrate in a process chamber; exposing the substrate to a substantially continuous flow of a process gas composition under process conditions, and providing a period of non-pulsing. Next, a pulse of a precursor is provided to the process environment. Under the process conditions, the precursor does not react with the process gas composition. Once the precursor has been provided to the process environment, a second period of non-pulsing is provided. Next, a high frequency power is provided to the process environment to produce a plasma. Under the plasma conditions, the process gas composition does react with the precursor. The reaction produces a film layer. The steps of pulsing and non-pulsing are repeated until a desired thickness of the film layer has been formed.

The methods of the present invention eliminate the need to provide a carrier gas and/or a purge gas in addition to a reactant gas unlike prior art methods. Instead, a "process gas" or "process gas composition" is provided to a chamber in a continuous or substantially continuous manner throughout the deposition of the desired film layer. Essentially any film layer can be deposited in this manner using any precursor and process gas combination, as long as the precursor and the process gas composition do not react with each other (or react minimally) under process conditions, but do react with each other when the process environment is supplied with enough energy to produce a plasma.

BRIEF DESCRIPTION OF THE DRAWINGS

So that the manner in which the above recited features of the present invention can be understood in detail, a more particular description of the invention, briefly summarized above, may be had by reference to the embodiments which are described in the present specification and illustrated in the appended drawings. It is to be noted, however, that the specification and appended drawings illustrate only certain embodiments of this invention and are therefore not to be considered limiting of its scope, for the invention may admit to other equally effective embodiments.

FIGS. 10A–10C depict cross-sectional views of a substrate at different stages of a bottom-gate thin film transistor (TFT) fabrication sequence.

DETAILED DESCRIPTION OF THE INVENTION

The methods of the present invention relate to methods of cyclical deposition to form film layers on a substrate. The methods provided eliminate the need to provide a carrier gas and/or a purge gas in addition to a reactant gas. Instead, a process gas or process gas composition is provided to a chamber in a substantially continuous manner throughout the deposition of the desired film layer. Essentially any film layer can be deposited in this manner using any precursor and process gas combination, as long as the precursor and the process gas composition do not react with each other (or react minimally) under process conditions, but do react with each other when the process environment is hit with enough energy to produce a plasma.

Figure 1:
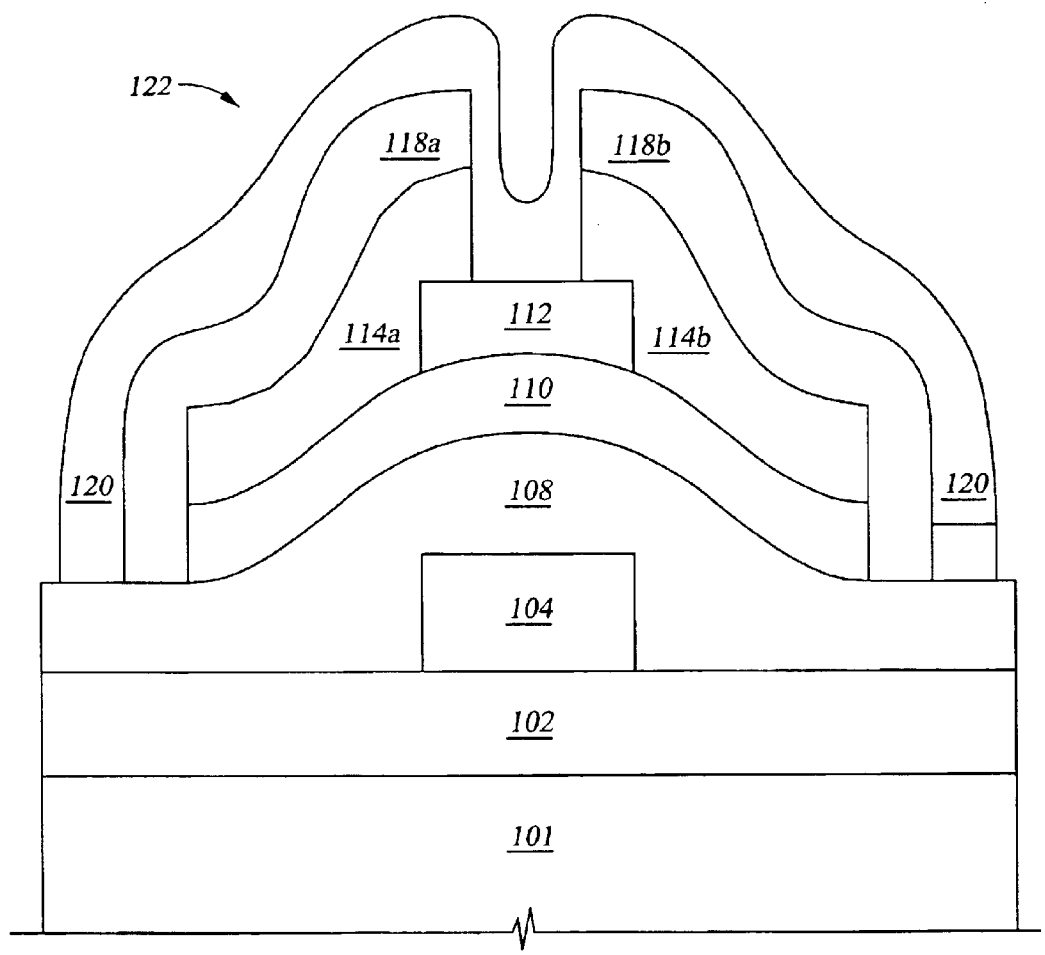
FIG. 1 depicts a cross-sectional schematic view of a bottom-gate thin film transistor (TFT)
Figure 2:
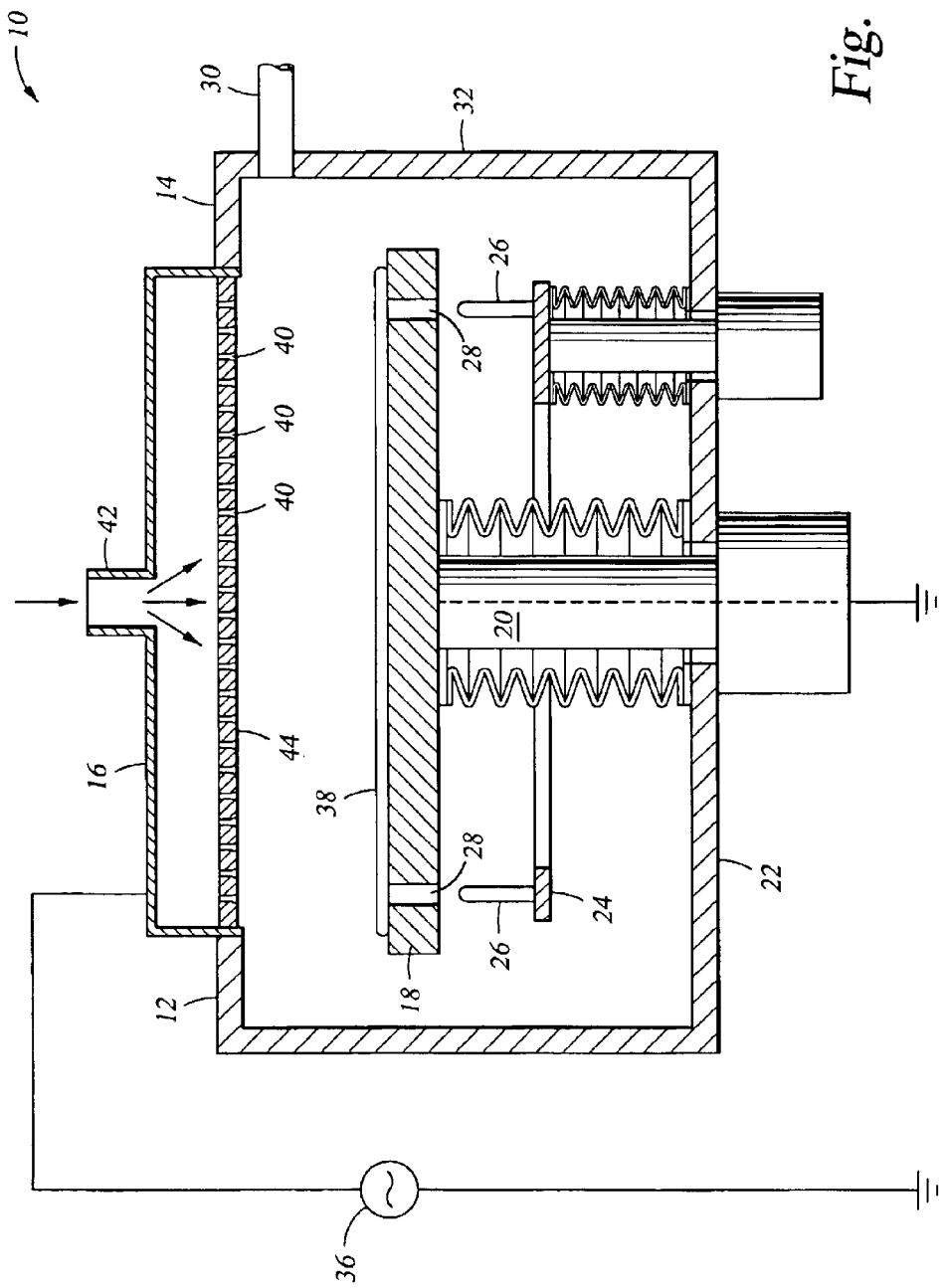
FIG. 2 depicts a schematic, cross-sectional view of a process chamber that may be used to practice the methods described herein.

FIG. 2 shows a schematic sectional view of a process chamber apparatus 10 in which the methods of the present invention may be carried out. Apparatus 10 comprises a deposition chamber 12 that has a top wall 14 with an opening therethrough and a first electrode 16, such as a gas inlet manifold, within the opening. Alternatively, the top wall 14 can be solid with the first electrode 16 being adjacent to the inner surface. Within chamber 12 is a susceptor 18 in the form of a plate that extends parallel to the first electrode 16. The susceptor 18 may be made of aluminum and coated with a layer of aluminum oxide. The susceptor 18 is connected to ground so that it serves as a second electrode. The susceptor 18 is mounted on the end of a shaft 20 that extends vertically through a bottom wall 22 of the deposition chamber 12. The shaft 20 is movable vertically so as to permit movement of the susceptor 18 vertically toward and away from the first electrode 16. A lift-off plate 24 extends horizontally between the susceptor 18 and the bottom wall 22 of the deposition chamber 12 substantially parallel to the susceptor 18. Lift-off pins 26 project vertically upwardly from the lift-off plate 24. The lift-off pins 26 are positioned to be able to extend through holes 28 in the susceptor 18, and are of a length slightly longer than the thickness of the susceptor 18. While there are only two lift-off pins 26 shown in the figure, there may be more of the lift-off pins 26 spaced around the lift-off plate 24. A gas outlet 30 extends through a side wall 32 of the deposition chamber 12 and is connected to means (not shown) for evacuating the deposition chamber 12. A gas inlet pipe 42 extends through the first electrode 16 of the deposition chamber 12, and is connected through a gas switching network (not shown) to sources (not shown) of various gases. The first electrode 16 includes a plate 40 with holes 44. The first electrode 16 is connected to an RF power source 36. A transfer plate (not shown) is typically provided to carry substrates through a load-lock door (not shown) into the deposition chamber 12 and onto the susceptor 18, and also to remove the coated substrate from the deposition chamber 12.

In the operation of the process chamber 10, a substrate 38 is first loaded into the deposition chamber 12 and is placed on the susceptor 18 by the transfer plate (not shown). The substrate 38 is of a size to extend over the holes 28 in the susceptor 18. The susceptor 18 lifts the substrate 38 off the lift-off pins 26 by moving shaft 20 upwards such that the lift-off pins 26 do not extend through the holes 28, and the susceptor 18 and substrate 38 are relatively close to the first electrode 16. The electrode spacing or the distance between the substrate surface and the discharge surface of the first electrode 16 may be optimized depending on the kind of precursor and process gas used, as well as on the desired properties of the resulting film.

Film Formation

Methods of film layer deposition are described. The film layer is deposited using a cyclical deposition process. The cyclical deposition process comprises adsorbing a precursor on the substrate, subsequently, when energy is supplied to the system, the precursor reacts with the process gas or process gas composition to form the film layer on the substrate. Any film layer can be deposited in this manner using any precursor and process gas combination, so long as the precursor and the process gas composition do not react with each other (or react minimally) under process conditions, but do react with each other when a plasma is introduced into the process environment. One such film layer is a gate dielectric layer, for example, silicon nitride ($Si_3N_4$), silicon oxide (SiO), silicon dioxide ($SiO_2$), aluminum nitride, or aluminum oxide.

Figure 3:
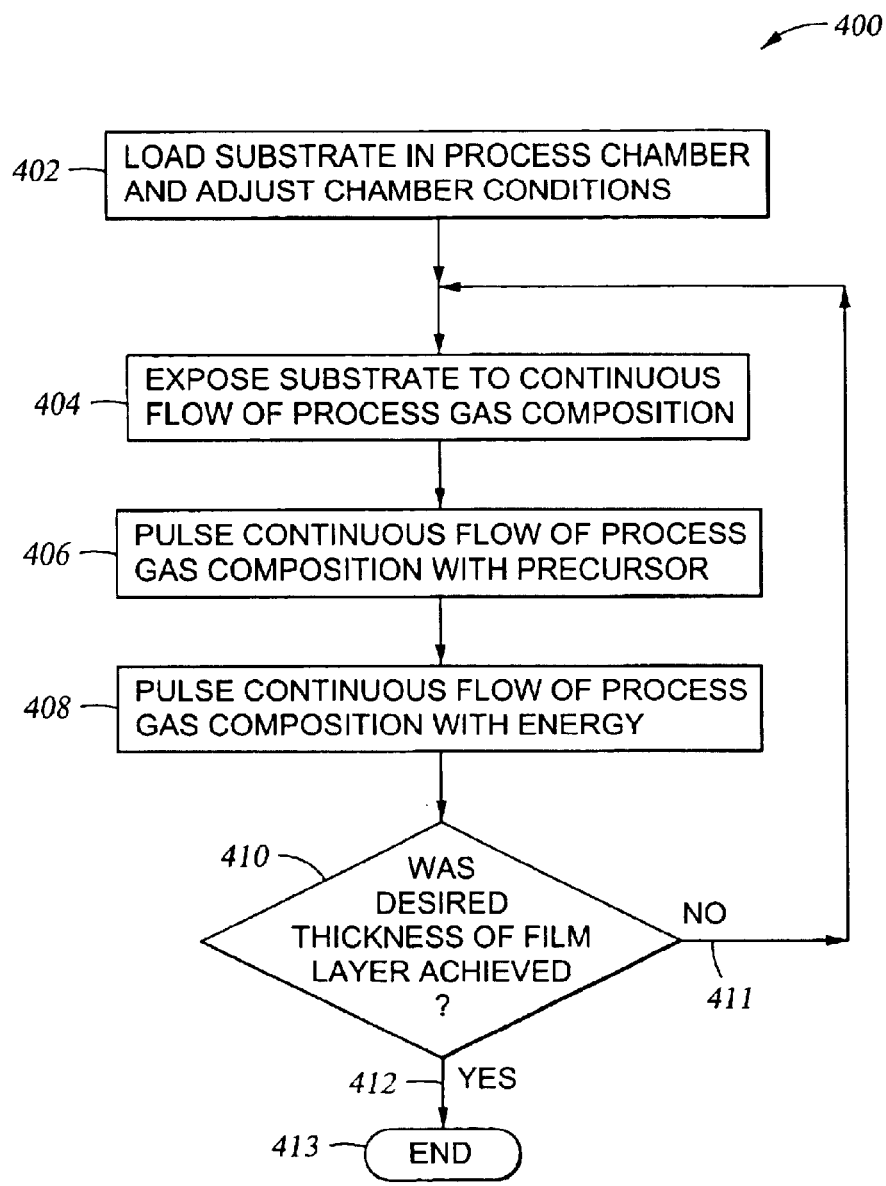
FIG. 3 illustrates a process sequence for film layer formation using cyclical deposition techniques according to one embodiment of the present invention.

FIG. 3 illustrates a process sequence 400 illustrating the various steps used for the deposition of a film layer. These steps may be performed in a process chamber similar to that described above with reference to FIG. 2. In general, deposition conditions such as temperature, pressure, process gas and precursor flow rates, power and pulse times will vary depending on the process gas, precursor and chamber being used. However, conditions are selected such that the precursor and the process gas composition do not react with each other (or react minimally) under the process conditions, but do react with each other when a plasma is introduced into the process environment.

As shown in step 402, a substrate is provided to the process chamber. The substrate may be, for example, a silicon, glass or clear plastic material suitable for film formation. Process chamber conditions, such as temperature and pressure, are adjusted to enhance the reaction of the precursor and the process gas. In general, for film layer deposition according to the present invention, the substrate should be maintained at a temperature of less than about 500° C., preferably at about 350° C., and at a process chamber pressure of between about 10 millitorr and about 10 torr.

However, in the present invention, the process gas or process gas composition is a reactant gas. In embodiments of the present invention where a substantially constant process gas flow is desired, a gas stream is established within the process chamber as indicated in step 404. Process gases and process gas compositions are selected so as to act as a reactant gas as well as a carrier gas and/or a purge gas. Typically, a carrier gas is a non-reactive gas such as, for example, helium (He), argon (Ar), nitrogen ($N_2$), hydrogen ($H_2$), or combinations thereof. Purge gases also are non-reactive gases, and can be the same or different than the gas used as a carrier gas. Unlike carrier gases, however, purge gases are not provided in a continuous or substantially continuous flow, but are instead provided to the system at predetermined intervals.

Reactant gases are those gases that react within the chamber to effect some chemical reaction. For example, reactant gases may serve as a catalyst for a reaction or, more typically, as a reactant in the chemical reaction. Depending on the system and chemical reaction that is to take place, reactant gases typically are different in composition from the non-reactive carrier gases or purge gases. Reactive gases include, for example, ammonia ($NH_3$), hydrazine ($N_2H_4$), nitrogen ($N_2$) and combinations thereof, among others, for the deposition of nitride layers. Suitable reactant gases may also include oxygen ($O_2$), ozone ($O_3$), hydrogen ($H_2$), water vapor ($H_2O$) and combinations thereof, among others, for the deposition of oxide layers. In the current invention, one gas composition (the process gas or process gas composition) is used to serve the purposes of all of the gases used in prior art methods—the carrier gas, the purge gas and the reactive gas.

The conditions for the delivery of the process gas or process gas composition to the chamber are selected depending, among other things, on the nature of the process gas used, other process conditions (such as chamber temperature and pressure), and chamber size. For example, process gases may be provided to the chamber at 200–3000 sccm or greater.

Referring to step 406, after the process gas stream is established within the process chamber, a pulse of a precursor is added to the gas stream. For example, a silicon-containing precursor may comprise a halogenated silicon compound, such as silicon tetrachloride ($SiCl_4$), dichlorosilane ($Si_2Cl_2H_2$), and trichlorosilane ($SiCl_3H$). The silicon-containing precursor may also comprise other suitable silicon compounds such as siloxane compounds, silane ($SiH_4$), or disilane ($Si_2H_6$), among others. The term pulse as used herein refers to a dose of material injected into the process chamber or into the gas stream. Such a dose may be a single injection of pre-determined duration, or several injections in succession. The pulse of the precursor lasts for a pre-determined time interval.

The time interval for the pulse of the precursor is variable depending upon a number of factors such as, for example, the volume capacity of the process chamber employed, the vacuum system coupled thereto and the volatility/reactivity of the reactants used. For example, a precursor pulse may last for about 0.2 seconds to about 5 seconds, or, preferably, about 0.5 second to about 2 seconds, or more preferably for about 0.7 seconds to about 1 second. However, the duration of the precursor pulse will vary depending on chamber and substrate size and precursor and process gas flow rate. Flow rate for the precursor may be about 100 sccm to about 1000 sccm, and preferably is about 200–500 sccm. In general, the process conditions are selected advantageously so that a pulse of the precursor provides a sufficient amount so that at least a monolayer of the precursor is adsorbed on the substrate. Thereafter, excess precursor remaining in the chamber may be removed from the process chamber by the process gas stream in combination with the vacuum system.

In step 408, after the excess precursor has been sufficiently removed from the process chamber by the process gas stream, a high frequency power, such as an RF power, is applied to the chamber, for example, via a showerhead or susceptor (substrate support) to generate a plasma comprising the process gas composition within the process chamber. The application of the high frequency power to the substrate support pedestal lasts for a predetermined time interval, of, for example, about 2 to about 10 seconds, or of about 3 to about 5 seconds. In general, for film layer deposition, a high frequency power of about 500 Watts to about 2000 Watts may be applied or, preferably a high frequency power of about 750 watts to about 1750 watts is applied, or, preferably a high frequency power of about 900 to about 1200 is applied.

Steps 404 through 408 comprise one embodiment of a deposition cycle for a film layer. For such an embodiment, a substantially constant flow of process gas is provided to the process chamber modulated by alternating periods of pulsing and non-pulsing where the periods of pulsing alternate between the precursor and the high frequency power, and the periods of non-pulsing consist essentially of the process gas stream. The present method is drawn to eliminating the need to provide a carrier gas and/or purge gas in addition to a reactant gas. Instead, a process gas composition (comprising one or more reactant gases) is used. One skilled in the art, however, understands that substrate processing may include stopping the flow of the process gas composition periodically or alternating or combining the process gas with another gas during processing.

The time interval for each of the pulses of the precursor and the high frequency power may have the same duration. That is, the duration of the pulse of the precursor may be identical to the duration of the pulse of the high frequency power. For such an embodiment, a time interval ($T_1$) for the pulse of the precursor is equal to a time interval ($T_2$) for the pulse of the high frequency power.

Alternatively, the time interval for each of the pulses of the precursor and the high frequency power may have different durations. That is, the duration of the pulse of the precursor may be shorter or longer than the duration of the pulse of the high frequency power. For such an embodiment, a time interval ($T_1$) for the pulse of the precursor is different than a time interval ($T_2$) for the pulse of the high frequency power.

In addition, the periods of non-pulsing between each of the pulses of the precursor and the high frequency power may have the same duration. That is, the duration of the period of non-pulsing between each pulse of the precursor and each of the pulses of the high frequency power is identical. For such an embodiment, a time interval ($T_3$) of non-pulsing between the pulse of the precursor and the pulse of the high frequency power is equal to a time interval ($T_4$) of non-pulsing between the pulse of the high frequency power and the pulse of the precursor. During the time periods of non-pulsing the constant process gas stream is provided to the process chamber.

Alternatively, the periods of non-pulsing between each of the pulses of the precursor and the high frequency power may have different durations. That is, the duration of the period of non-pulsing between each pulse of the precursor and each pulse of the high frequency power may be shorter or longer than the duration of the period of non-pulsing between each pulse of the high frequency power and the precursor. For such an embodiment, a time interval ($T_3$) of non-pulsing between the pulse of the precursor and the pulse of the high frequency power is different from a time interval ($T_4$) of non-pulsing between the pulse of the high frequency power and the pulse of the precursor. During the time periods of non-pulsing only the constant process gas stream is provided to the process chamber.

The time intervals for each pulse of the precursor, the high frequency power and the periods of non-pulsing therebetween for each deposition cycle may have the same duration. For such an embodiment, a time interval ($T_i$) for the precursor, a time interval ($T_2$) for the high frequency power, a time interval ($T_3$) of non-pulsing between the pulse of the precursor and the pulse of the high frequency power and a time interval ($T_4$) of non-pulsing between the pulse of the high frequency power and the pulse of the precursor each have the same value for each subsequent deposition cycle. For example, in a first deposition cycle ($C_1$), a time interval (Ti) for the pulse of the precursor has the same duration as the time interval (Ti) for the pulse of the precursor in subsequent deposition cycles ($C_2 \ldots C_N$). Similarly, the duration of each pulse of the high frequency power and the periods of non-pulsing between the pulse of the precursor and the high frequency power in deposition cycle ($C_1$) is the same as the duration of each pulse of the high frequency power and the periods of non-pulsing between the pulse of the precursor and the high frequency power in subsequent deposition cycles ($C_2 \ldots C_N$), respectively.

Additionally, the time intervals for at least one pulse of the precursor, the high frequency power and the periods of non-pulsing therebetween for one or more of the deposition cycles of the gate dielectric layer deposition process may have different durations. For such an embodiment, one or more of the time intervals ($T_1$) for the pulse of the precursor, the time intervals ($T_2$) for the pulse of the high frequency power, the time intervals ($T_3$) of non-pulsing between the pulse of the precursor and the pulse of the high frequency power and the time intervals ($T_4$) of non-pulsing between the pulse of the high frequency power and the pulse of the precursor may have different values for one or more subsequent deposition cycles of the film layer deposition process. For example, in a first deposition cycle ($C_1$), the time interval ($T_1$) for the pulse of the precursor may be longer or shorter than the time interval ($T_1$) for the pulse of the precursor in a subsequent deposition cycle ($C_2 \ldots C_N$). Similarly, the duration of each pulse of the high frequency power and the periods of non-pulsing between the pulse of the precursor and the high frequency power in deposition cycle ($C_1$) may be the same or different than the duration of each pulse of the high frequency power and the periods of non-pulsing between the pulse of the precursor and the high frequency power in subsequent deposition cycles ($C_2 \ldots C_N$), respectively. One skilled in the art recognizes that a "pulse" may be a single dose or injection of a compound or application of energy; alternatively, a "pulse" may be two or more sequential doses or injections.

Referring to step 410, after each deposition cycle (steps 404 through 408), a certain thickness of the film layer will be formed on the substrate. Depending on specific device requirements, subsequent deposition cycles may be needed 411 to achieve a desired thickness. As such, steps 404 through 408 are repeated until the desired thickness for the film layer is achieved. Thereafter, when the desired thickness for the film layer is achieved 412, the process is stopped as indicated by step 413.

One exemplary process of depositing a silicon-containing gate film layer comprises depositing a silicon-containing gate dielectric layer by providing pulses of silicon tetrachloride ($SiCl_4$) in a process gas mixture of hydrogen ($H_2$)/oxygen ($O_2$). The tetrachloride ($SiCl_4$) may be provided to an appropriate flow control valve, for example, an electronic flow control valve, at a flow rate of between about 50 sccm (standard cubic centimeters per minute) and about 500 sccm, preferably at about 200 sccm, and thereafter pulsed for about 2 seconds or less, preferably about 0.5 to about 1 second. The hydrogen ($H_2$)/oxygen ($O_2$) is provided at a flow rate between about 500 sccm to about 2500 sccm, preferably about 1000–2000 sccm. The process gas may be provided to an appropriate flow control valve, for example, an electronic flow control valve. The substrate may be maintained at a chamber pressure between about 0.05 torr to about 10 torr. The substrate is maintained at a temperature less than about 500° C., and preferably at less than about 350° C. The above-mentioned flow rates for the silicon-containing precursor, and the reactant gas may be varied, depending upon the volume capacity of the process chamber. The high frequency energy source may be RF supplied at about 250 to about 2000 Watts, and preferably at about 500 to about 1500 Watts.

Figure 4:
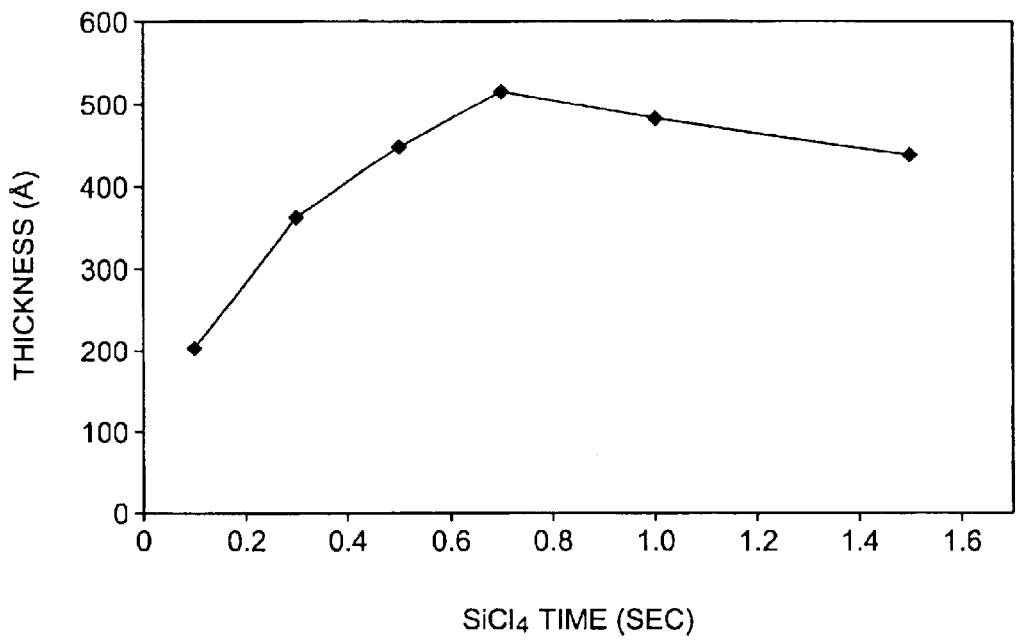
FIG. 4 is a graph showing the effect of precursor flow on film thickness.
Figure 5:
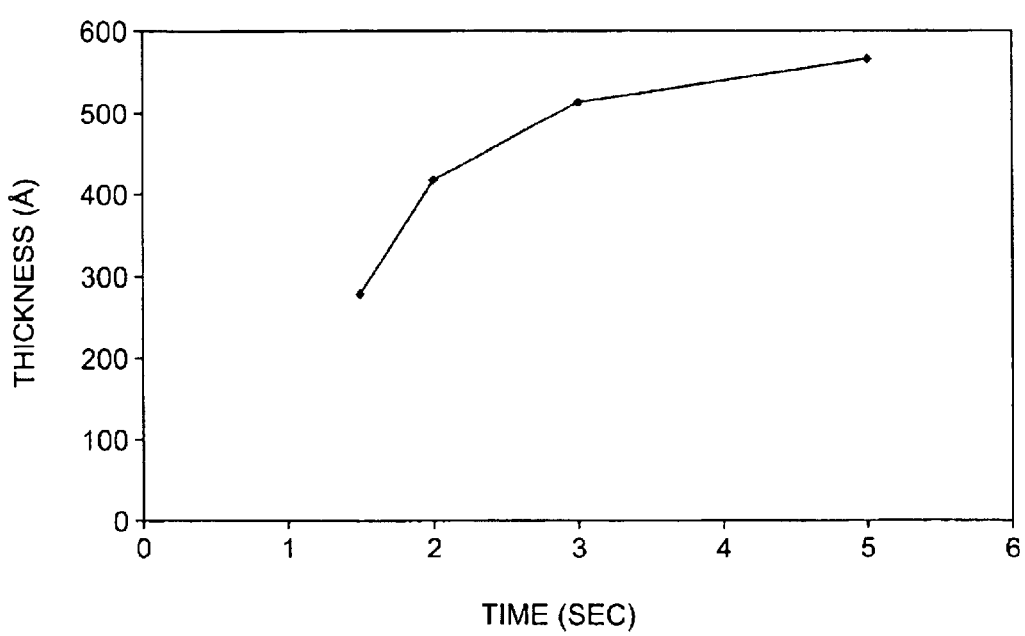
FIG. 5 is a graph showing the effect of the length of the RF pulse on film thickness.

FIGS. 4–9 are graphs showing the effect of various deposition parameters on film thickness for the deposition of a silicon dioxide gate dielectric layer. FIG. 4 shows the effect of the length of time of a $SiCl_4$ pulse (at a flow rate of 200 sccm) on film thickness. Note that maximum thickness is achieved at less than 0.8 seconds per pulse, and that thickness decreases with time over 1 second. FIG. 5 shows the effect of the length of the RF pulse on film thickness. Note that maximum efficiency for the pulse is achieved at between 3 and 5 seconds.

Figure 6:
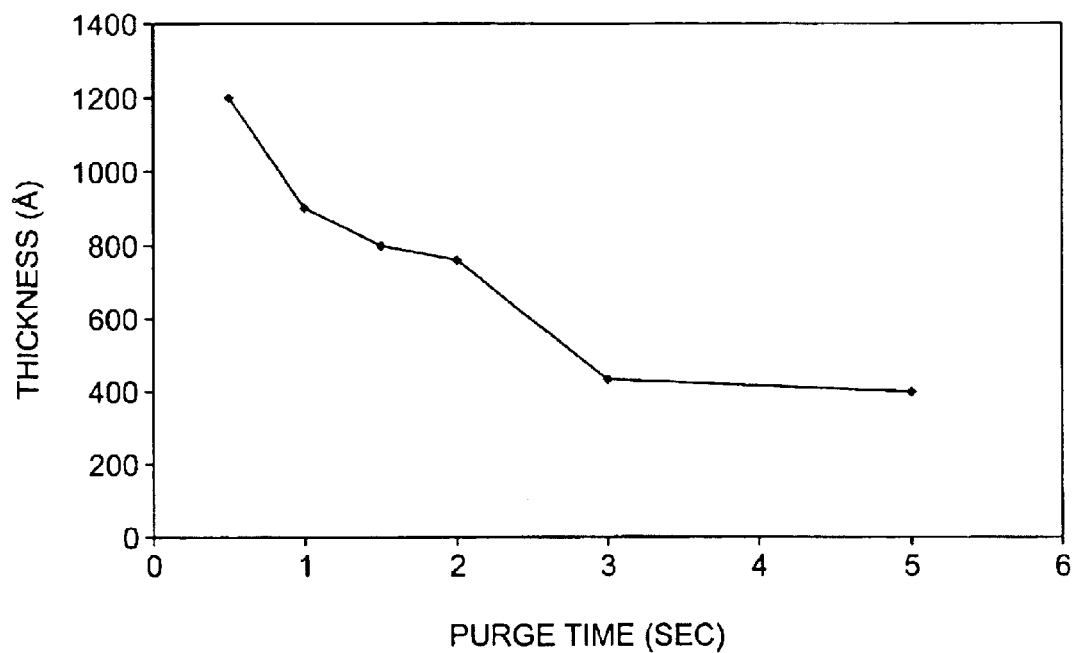
FIG. 6 is a graph showing the effect of non-pulsing time between the precursor pulse and the plasma pulse on film thickness.
Figure 7:
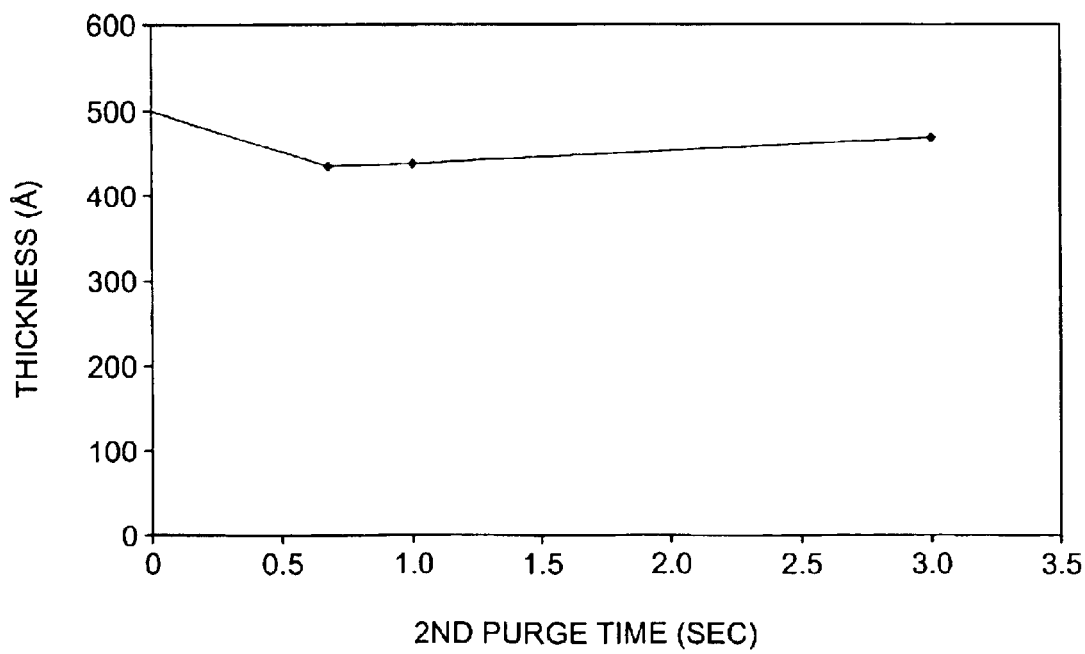
FIG. 7 is a graph showing the effect of non-pulsing time between the plasma pulse and the precursor pulse on film thickness.
Figure 8:
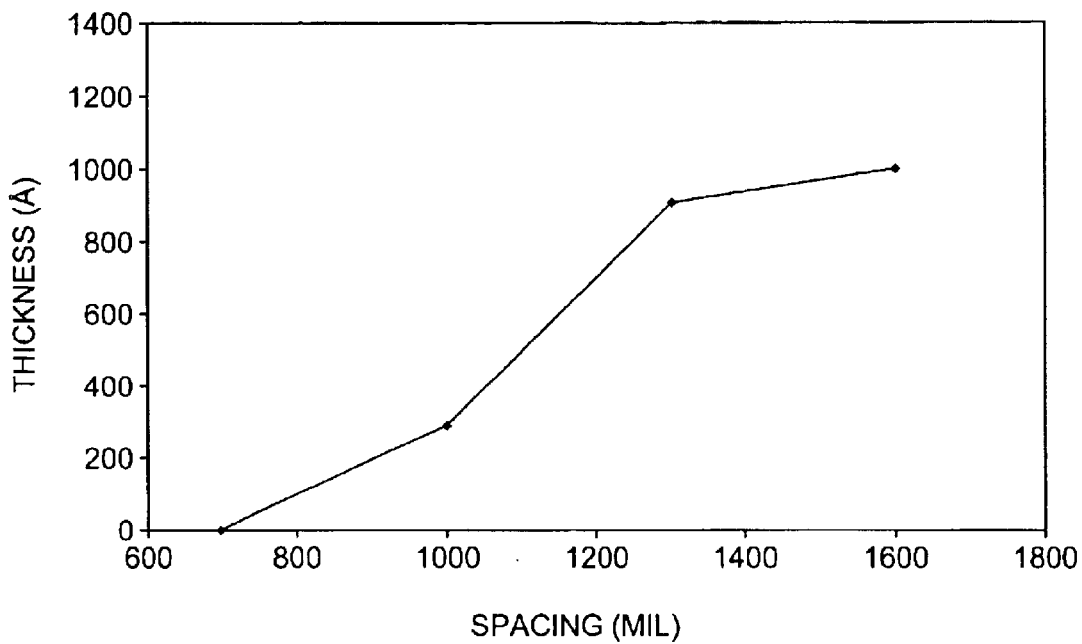
FIG. 8 is a graph showing the effect of spacing (in millimeters) between the electrode and the substrate on film thickness
Figure 9:
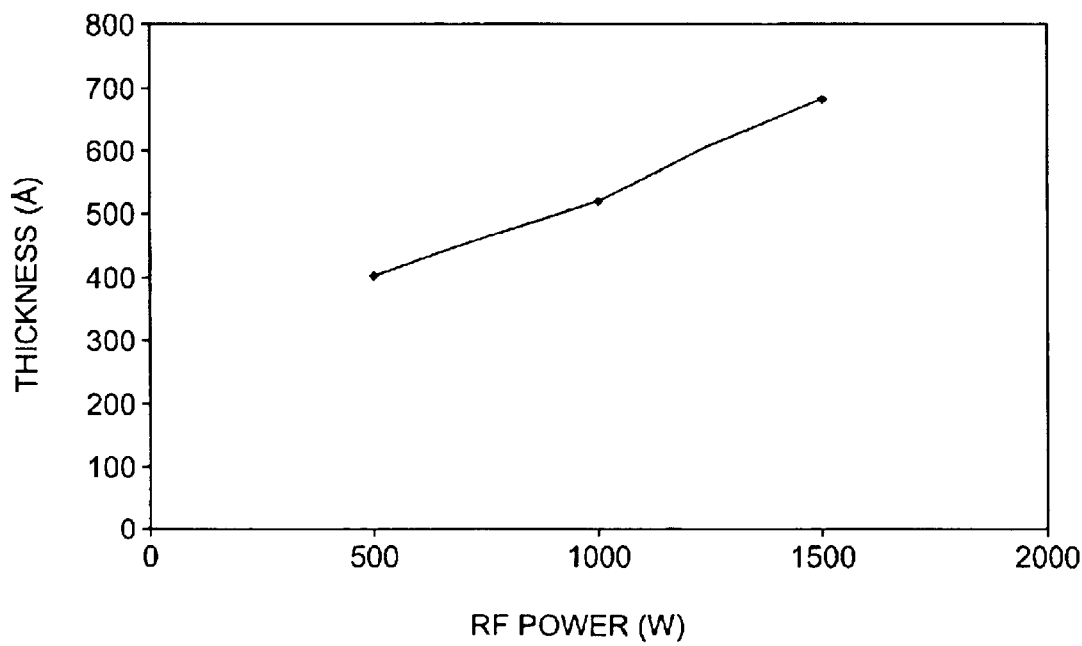
FIG. 9 is a graph showing the effect of RF power on film thickness.

FIG. 6 shows the effect of time for the non-pulsing interval between the pulse of the precursor and the energy pulse, where FIG. 7 shows the effect of time for the non-pulsing interval between the energy pulse and the pulse of the precursor. FIG. 8 shows the effect of electrode spacing on film thickness, and FIG. 9 shows the effect of RF power on film thickness.

Integrated Circuit Fabrication Processes
Bottom-Gate Thin Film Transistor (TFT)

FIGS. 10A–10C illustrate cross-sectional schematic views of substrate structure 650 during different stages of a bottom-gate thin film transistor (TFT) fabrication sequence incorporating a gate dielectric layer formed using a cyclical deposition process. This particular transistor fabrication sequence is for a switch in an active matrix liquid crystal display and the process depicts the formation of one embodiment of an array of switches used in an active matrix liquid crystal display. FIG. 10A, for example, illustrates a cross-sectional view of a substrate 600. The substrate 600 may comprise a material that is essentially optically transparent in the visible spectrum, such as, for example, glass or clear plastic, including soda-lime glass, borosilicate glass, or quartz glass. The substrate may be of varying shapes or dimensions. Typically, for thin film transistor (TFT) applications, the substrate is a glass substrate with dimensions greater than about 500 mm$^2$.

The substrate 600 may have an underlayer 602 thereon. The underlayer 602 may be an insulating material, for example, such as silicon dioxide ($SiO_2$) or silicon nitride (SiN). The underlayer 602 may be formed using conventional deposition techniques.

A gate metal layer 604 is formed on the underlayer 602. The gate metal layer 604 comprises an electrically conductive layer that controls the movement of charge carriers within the thin film transistor (TFT). The gate metal layer 604 may comprise a metal such as, for example, aluminum (Al), tungsten (W), chromium (Cr), tantalum (Ta), or combinations thereof, among others. The gate metal layer 604 may be formed using conventional deposition, lithography and etching techniques.

Referring to FIG. 10B, a gate dielectric layer 608 is formed on the gate metal layer 604. The gate dielectric layer 608 may comprise, for example silicon nitride ($Si_3N_4$), silicon oxide (SiO), and silicon dioxide ($SiO_2$), among others, deposited using an embodiment of the cyclical deposition technique described above with reference to FIG. 3. The gate dielectric layer 608 may be formed to a thickness in the range of about 20 Angstroms to about 5000 Angstroms.

Alternatively, the gate dielectric layer 608 may comprise two or more layers. For such an embodiment, a first gate dielectric layer 608a may be formed using an embodiment of the cyclical deposition techniques described above with reference to FIG. 3. The first gate dielectric layer 608a may have a composition similar to gate dielectric layer 608.

Following the deposition of the first gate dielectric layer 608a, a second gate dielectric layer 608b may be deposited thereon using conventional deposition techniques such as, for example, chemical vapor deposition (CVD) or plasma enhanced chemical vapor deposition (PECVD). The second gate dielectric layer may also comprise silicon oxide (SiO), silicon dioxide ($SiO_2$), or silicon nitride ($Si_3N_4$).

Additionally, the composition of first gate dielectric layer 608a and second gate dielectric layer 608b optionally may be different. For example, the first gate dielectric layer 608a may comprise silicon dioxide ($SiO_2$), while the second gate dielectric layer may comprise silicon nitride ($Si_3N_4$).

Referring to FIG. 10C, a bulk semiconductor layer 610 is formed on the gate dielectric layer 608. Bulk semiconductor layer 610 may be formed using conventional deposition techniques. The bulk semiconductor layer 610 may comprise, for example, amorphous silicon or polycrystalline silicon. Bulk semiconductor layer 610 may be deposited to a thickness within a range of about 20 Angstroms to about 5000 Angstroms.

An etch stop layer 612 may be formed on bulk semiconductor layer 610. The etch stop layer 612 may comprise an insulating material. The etch stop layer 612 may be formed using, for example, plasma enhanced chemical vapor deposition, chemical vapor deposition, physical vapor deposition, or other conventional methods known to the art. Etch stop layer 612 and bulk semiconductor layer 610 are lithographically patterned and etched using conventional techniques.

A doped semiconductor layer 614 is formed on the patterned etch stop layer 612 and semiconductor bulk layer 610. Doped semiconductor layer 614 may comprise, for example, silicon. The doped semiconductor layer 614 may be deposited to a thickness within a range of about 10 Angstroms to about 100 Angstroms. The doped semiconductor layer 614 directly contacts portions of the bulk semiconductor layer 610, forming a semiconductor junction.

A transparent conductor layer 616 is formed on portions of the gate dielectric layer 608 and the doped semiconductor layer 614. Transparent conductor layer 616 comprises a material that is generally optically transparent in the visible spectrum and is electrically conductive. Transparent conductor layer 616 may comprise, for example, indium tin oxide (ITO), zinc oxide, among others. Transparent conductor layer 616 is lithographically patterned and etched using conventional techniques.

A conductive layer 618 is formed on portions of the doped semiconductor layer 614 and the transparent conductor layer 616. Conductive layer 618 may comprise a metal such as, for example, aluminum (Al), tungsten (W), molybdenum (Mo), chromium (Cr), tantalum (Ta), and combinations thereof, among others. The conductive layer 618 may be formed using conventional deposition techniques.

Both the conductive layer 618 and the doped semiconductor layer 614 may be lithographically patterned to define a source region 614a and a drain region 614b as well as a source contact 618a and a drain contact 618b. The source 614a and drain 614b regions of the thin film transistor (TFT) are separated from one another by the stop etch layer 612.

Thereafter, a passivation layer 620 may be deposited atop the substrate structure 650. Passivation layer 620 conformably coats exposed surfaces of gate dielectric layer 608, source contact 618a, drain contact 618b and etch stop layer 612, and semiconductor source 614a and drain 614b. The passivation layer 620 is generally an insulator and may comprise, for example, silicon oxide or silicon nitride. The passivation layer 620 may be formed using conventional deposition techniques.

Top-Gate Thin Film Transistor (TFT)

Figure 11A:
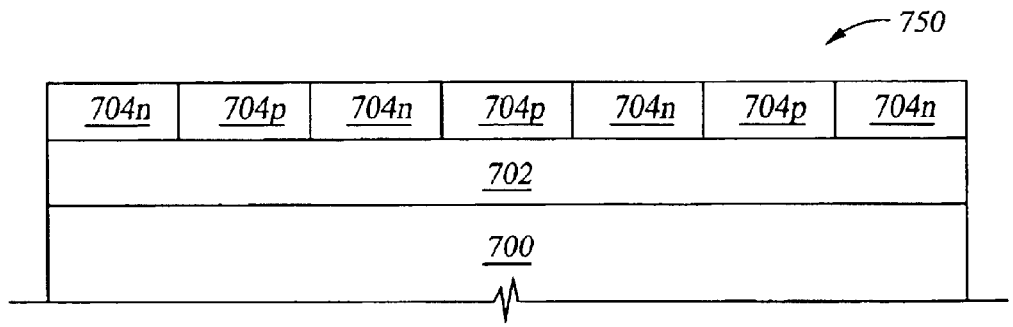
FIGS. 11A–11C depict cross-sectional views of a substrate at different stages of a top-gate thin film transistor (TFT) fabrication sequence.
Figure 11B:
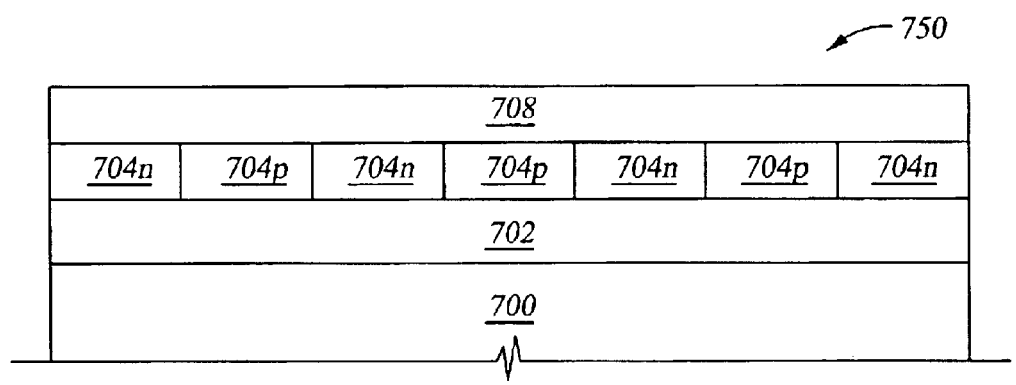
Figure 11C:
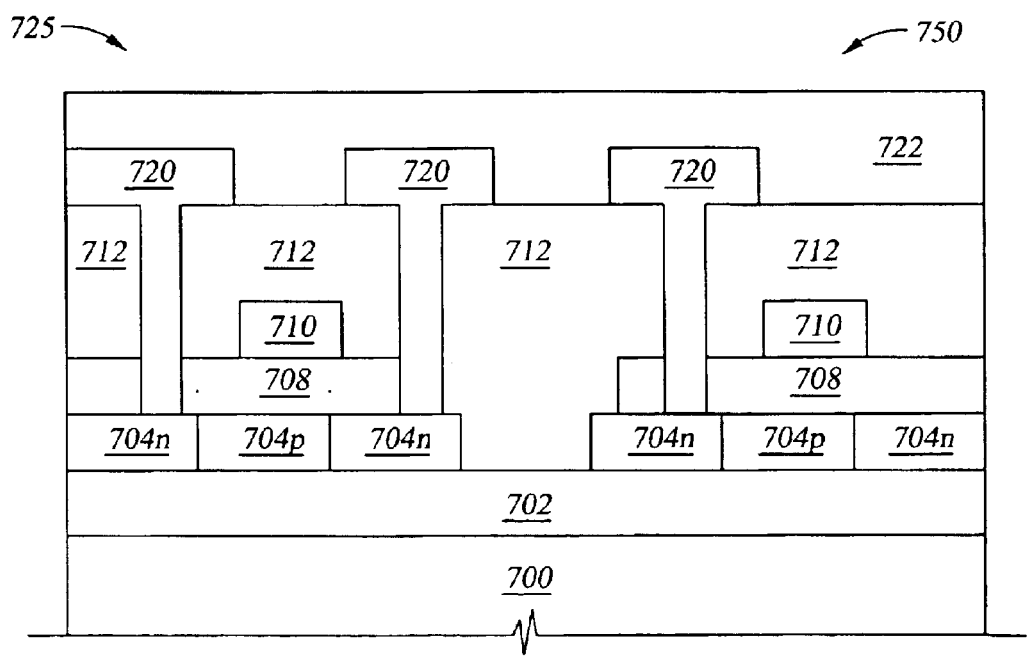

FIGS. 11A–11C illustrate cross-sectional schematic views of substrate structure 750 during different stages of a top-gate thin film transistor (TFT) fabrication sequence incorporating a gate dielectric layer formed using a cyclical deposition process. This transistor fabrication sequence is for a switch in an active matrix liquid crystal display and the process depicts the formation of one of an array of switches used in an active matrix liquid crystal display. The top-gate thin film transistor (TFT) may be, for example, a metal-oxide-semiconductor field effect transistor (MOSFET) or a junction field effect transistor (JFET).

FIG. 11A, for example, illustrates a cross-sectional view of a substrate 700. The substrate may comprise a material that is essentially optically transparent in the visible spectrum, such as, for example, glass or clear plastic, including soda-lime glass, borosilicate glass, or quartz. The substrate may have an underlayer 702 thereon. The underlayer 702 may be an insulating material, such as, for example, silicon dioxide ($SiO_2$) or silicon nitride (SiN).

A doped semiconductor layer 704 is deposited on the underlayer 702. The doped semiconductor layer 704 may comprise silicon. The doped semiconductor layer 704 includes n-type doped regions 704n and p-type doped regions 704p. The interfaces between n-type regions 704n and p-type regions 704p are semiconductor junctions that support the ability of the thin film transistor (TFT) to act as a switching device.

Referring to FIG. 11B, a gate dielectric layer 708 is deposited on the n-type doped regions 704n and the p-type doped regions 704p. The gate dielectric layer 708 may comprise, for example, silicon nitride ($Si_3N_4$), silicon oxide (SiO), silicon dioxide ($SiO_2$), among others.

The gate dielectric layer 708 may be formed using an embodiment of the cyclical deposition process described above with reference to FIG. 3. The gate dielectric layer 708 may be deposited to a thickness within a range of about 20 Angstroms to about 5000 Angstroms.

A gate metal layer 710 is deposited on the gate dielectric layer 708, as shown in FIG. 11C. The gate metal layer 710 comprises an electrically conductive layer that controls the movement of charge carriers within the thin film transistor (TFT). The gate metal layer 710 may comprise a metal such as, for example, aluminum (Al), tungsten (W), chromium (Cr), tantalum (Ta), or combinations thereof, among others. The gate metal layer 710 may be formed using conventional deposition techniques. After deposition, the gate metal layer is patterned to define gates using conventional lithography and etching techniques.

After the gate metal layers 710 are formed, an interlayer dielectric 712 is formed thereon. The interlayer dielectric 712 may comprise, for example, an oxide. Interlayer dielectric 712 may be formed using conventional deposition processes.

The interlayer dielectric 712 is patterned to expose the n-type doped regions 704n and the p-type doped regions 704p. The patterned regions of the interlayer dielectric 712 are filled with a conductive material to form contacts 720. The contacts 720 may comprise a metal such as, for example, aluminum (Al), tungsten (W), molybdenum (Mo), chromium (Cr), tantalum (Ta), and combinations thereof, among others. The contacts 720 may be formed using conventional deposition techniques.

Thereafter, a passivation layer 722 may be formed thereon in order to protect and encapsulate a completed thin film transistor 725. The passivation layer 722 is generally an insulator and may comprise, for example, silicon oxide or silicon nitride. The passivation layer 722 may be formed using conventional deposition techniques.

It is within the scope of the invention to form other devices that have configurations of semiconductor layers that are different from those described in FIGS. 10–11. For example, the switch may be any variety of bipolar or unipolar transistor devices wherein a gate dielectric layer is deposited using the cyclical deposition process described herein.

EXAMPLE

Table 1 shows two sets of processing conditions for an exemplary deposition of $SiC_2$ using the methods of the present invention. In the first set of data, the flow rate of both $H_2$ and $O_2$ is 500 sccm, whereas in the second set of data, the flow rate of both the $H_2$ and $O_2$ is 2000 sccm. In addition, note that the period of non-pulse between the pulse of the $SiCl_4$ precursor and the RF pulse is 0.5 second in the first data set and 3.0 in the second data set, and the power of the RF pulse is 1000 W in the first data set and 500 in the second data set. A D/R (film thickness divided by the number of cycles of deposition) of 1.06 was achieved in the first data set, whereas the second set of conditions resulted in a D/R of 0.69.

TABLE 1

| $H_2$ 500 | $H_2$ 500 | $H_2$ 500 | $H_2$ 500 | Temp | 300 | Thick | 1014 |
|---|---|---|---|---|---|---|---|
| $O_2$ 500 | $O_2$ 500 | $O_2$ 500 | $O_2$ 500 | Cycle | 960 | D/R | 1.06 |
| | | | $SiCl_4$ 200 | Spacing | 1100 | C-V | −0.87 |
| | 1000 W | | | | | | |
| 0.5 seconds | 3 seconds | 0.5 seconds | 0.7 seconds | | | | |
| $H_2$ 2000 | $H_2$ 2000 | $H_2$ 2000 | $H_2$ 2000 | Temp | 300 | Thick | 977 |
| $O_2$ 1000 | $O_2$ 1000 | $O_2$ 1000 | $O_2$ 1000 | Cycle | 1420 | D/R | 0.69 |
| | | | $SiCl_4$ 200 | Spacing | 1600 | C-V | −0.75 |
| | 500 W | | | | | | |
| 3 seconds | 3 seconds | 0.5 seconds | 0.7 seconds | | | | |

Figure 12A:
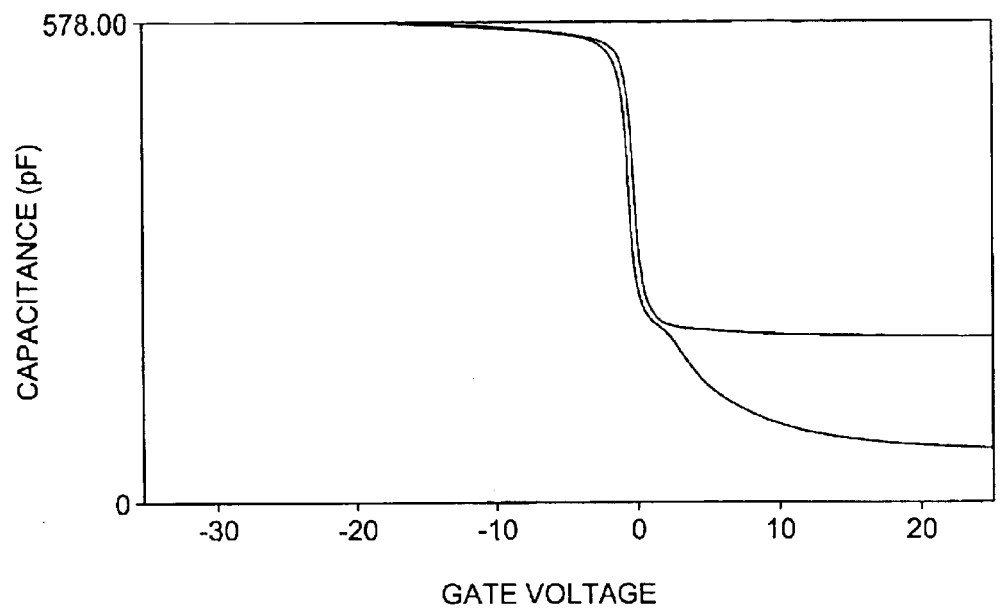
FIG. 12 shows flatbed voltage of a gate dielectric film deposited by the methods of the present invention before annealing (FIG. 12A) and after annealing (FIG. 12B).
Figure 12B:
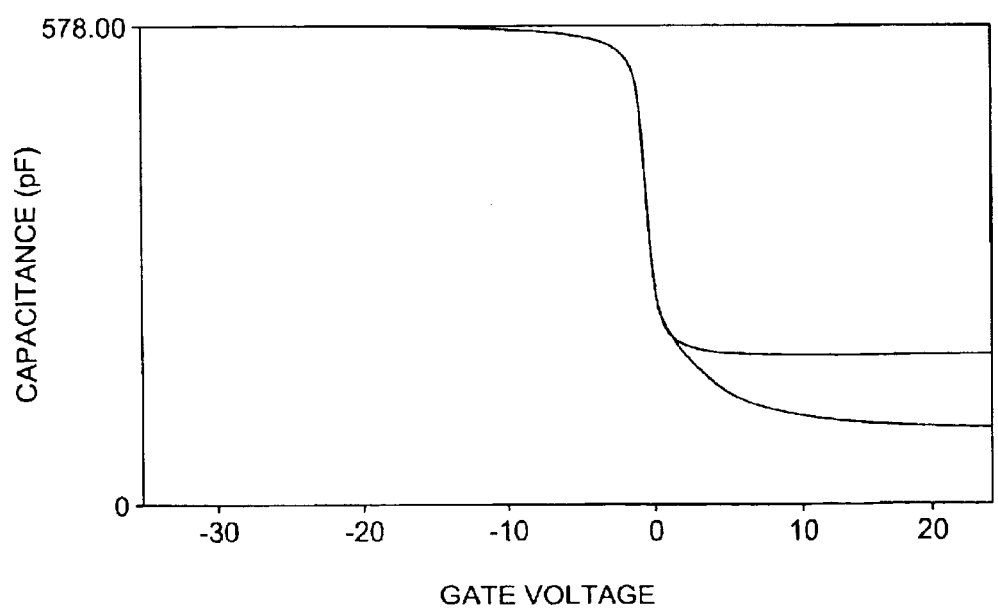
Figure 13:
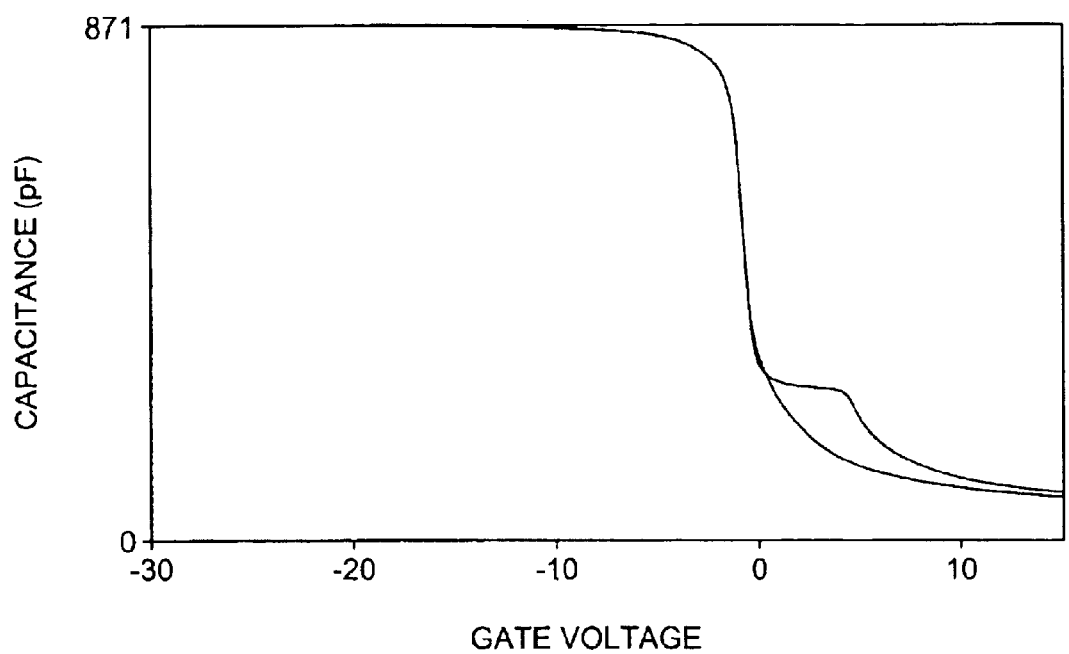
FIG. 13 shows flatbed voltage of a gate dielectric film deposited by the methods of the present invention.

FIGS. 12A, 12B and 13 show the flatband voltage achieved for films using the methods of the present invention. FIG. 12A shows the flatband voltage before annealing, and 12B shows the flatband voltage after annealing. FIG. 13 shows the flatband voltage of a film deposited at a flow rate for both $H_2$ and $O_2$ at 500 sccm, a flow rate of $SiCl_4$ at 200 sccm, a process temperature of 300° C., an electrode spacing of 1100, an RF power of 1000 W, and the times of 0.5 seconds for the non-pulses between the pulse of the RF and the $SiCl_4$ and the pulse of the RF and the $SiCl_4$ (i.e. both non-pulsing intervals), 3 seconds for the pulse of the RF, and 0.7 seconds for the pulse of the $SiCl_4$.

While the foregoing is directed to the preferred embodiment of the present invention, other and further embodiments of the invention may be devised without departing from the basic scope thereof, and the scope thereof is determined by the claims that follow.

What is claimed is:

1. A method for forming a film layer on a substrate in a process chamber, comprising:

(a) exposing said substrate to a substantially continuous flow of a process gas composition at a constant flow rate under process conditions for a first period of time;

(b) after the first period of time, pulsing a precursor into the chamber, wherein the substantially continuous flow of the process gas composition at the constant flow rate is maintained during the pulsing, and wherein said precursor does not react with said process gas under said process conditions; then (c) continuing the substantially continuous flow of the process gas composition at the constant flow rate for second period of time;

(d) after the second period of time, pulsing high frequency power in the chamber to produce plasma conditions, wherein the substantially continuous flow of the process gas composition at the constant flow rate is maintained during the pulsing high frequency power, and wherein under said plasma conditions said precursor reacts with said process gas; and (e) repeating (a), (b), (c), and (d) until a desired thickness of said film layer has been achieved, wherein said film layer is silicon nitride ($Si_3N_4$), silicon oxide (SiO) or silicon dioxide ($SiO_2$).

2. The method of claim 1, wherein said process gas composition consists essentially of ammonia ($NH_3$), hydrazine ($N_2H_4$), nitrogen ($N_2$), oxygen ($O_2$), ozone ($O_3$), hydrogen ($H_2$), water vapor ($H_2O$) or combinations thereof.

3. The method of claim 1, wherein said high frequency power is an RF power.

4. The method of claim 3, wherein said RF power is supplied to a showerhead.

5. The method of claim 3, wherein said RF power is supplied to a substrate support pedestal.

6. The method of claim 3, wherein said high frequency power is about 500 to 2000 Watts.

7. The method of claim 6, whereinsaid high frequency power is about 750 to about 1750 Watts.

8. The method of claim 7, wherein said high frequency power is about 900 to about 1200 Watts.

9. The method of claim 1, wherein the substrate is maintained at a temperature of less than 500° C.

10. The method of claim 9, wherein the substrate is maintained at a temperature of less than 350° C.

11. The method of claim 1, wherein the process chamber is maintained at a pressure of between about 10 millitorr and about 10 torr.

12. The method of claim 11, wherein the process chamber is maintained at a pressure of between about 0.5 torr and about 5 torr.

13. The method of claim 12, wherein the process chamber is maintained at a pressure of between about 1.0 torr and about 5 torr.

14. The method of claim 1, wherein said process gas composition is provided at a scorn of about 200 to about 3000.

15. The method of claim 1, wherein said pulsing of said precursor has a duration of about 0.5 to about 2 seconds.

16. The method of claim 15, wherein said pulsing of said precursor has a duration of about 0.7 to about 1 second.

17. The method of claim 1, wherein said pulsing high frequency power comprises an RF pulse.

18. The method of claim 17, wherein said RF pulse has a duration of about 2 seconds to about 10 seconds.

19. The method of claim 18, wherein said RF pulse has a duration of about 3 seconds to about 5 seconds.

20. A method for forming a film layer on a substrate in a process chamber, comprising:

(a) exposing said substrate to a substantially continuous flow of a process gas composition at a constant flow rate under process conditions for a first period of time, wherein said process gas composition is a combination of $H_2$ and $O_2$ gases;

(b) after the first period of time, pulsing a precursor into the chamber, wherein the substantialy continuous flow of the process gas composition at the constant flow rate is maintained during the pulsing, and wherein said precursor does not react with said process gas under said process conditions; then (c) continuing the substantially continuous flow of the process gas composition at the constant flow rate for second period of time;

(d) after the second period of time, pulsing high frequency power in the chamber to produce plasma conditions, wherein the substantially continuous flow of the process gas composition at the constant flow rate is maintained during the pulsing high frequency power, and wherein under said plasma conditions said precursor reacts with said process gas; and (e) repeating (a), (b), (c), and (d) until a desired thickness of said film layer has been achieved.

21. A method for forming a film layer on a substrate in a process chamber, comprising:

(a) exposing said substrate to a substantially continuous flow of a process gas composition at a constant flow rate under process conditions for a first period of time;

(b) after the first period of time, pulsing a precursor into the chamber, wherein the substantially continuous flow of the process gas composition at the constant flow rate is maintained during the pulsing, wherein said precursor does not react with said process gas under said process conditions, and wherein said precursor is a halogenated silicon compound; then (c) continuing the substantially continuous flow of the process gas composition at the constant flow rate for second period of time;

(d) after the second period of time, pulsing high frequency power in the chamber to produce plasma conditions, wherein the substantially continuous flow of the process gas composition at the constant flow rate is maintained during the pulsing high frequency power, and wherein under said plasma conditions said precursor reacts with said process gas; and (e) repeating (a), (b), (c), and (d) until a desired thickness of said film layer has been achieved.

22. The method of claim 21, wherein said halogenated silicon compound is silicon tetrachloride ($SiCl_4$), dichlorosilane ($Si_2Cl_2H_2$), or trichlorosilane ($SiCl_3H$).

23. A method for forming a film layer on a substrate in a process chamber, comprising:

(a) exposing said substrate to a substantially continuous flow of a process gas composition at a constant flow rate under process conditions for a first period of time;

(b) after the first period of time, pulsing a precursor into the chamber, wherein the substantially continuous flow of the process gas composition at the constant flow rate is maintained during the pulsing, wherein said precursor does not react with said process gas under said process conditions, and wherein said precursor is a siloxane compound; then (c) continuing the substantially continuous flow of the process gas composition at the constant flow rate for second period of time;

(d) after the second period of time, pulsing high frequency power in the chamber to produce plasma conditions, wherein the substantially continuous flow of the process gas composition at the constant flow rate is maintained during the pulsing high frequency power, and wherein under said plasma conditions said precursor reacts with said process gas; and (e) repeating (a), (b), (c), and (d) until a desired thickness of said film layer has been achieved.

24. A method for forming a film layer on a substrate in a process chamber, comprising:

(a) exposing said substrate to a substantially continuous flow of a process gas composition at a constant flow rate under process conditions for a first period of time;

(b) after the first period of time, pulsing a precursor into the chamber, wherein the substantially continuous flow of the process gas composition at the constant flow rate is maintained during the pulsing, wherein said precursor does not react with said process gas under said process conditions, and wherein said precursor is silane ($SiH_4$) or disilane ($Si_2H_6$); then (c) continuing the substantially continuous flow of the process gas composition at the constant flow rate for second period of time;

(d) after the second period of time, pulsing high frequency power in the chamber to produce plasma conditions, wherein the substantially continuous flow of the process gas composition at the constant flow rate is maintained during the pulsing high frequency power, and wherein under said plasma conditions said precursor reacts with said process gas; and (e) repeating (a), (b), (c), and (d) until a desired thickness of said film layer has been achieved.

25. A method for forming a film layer on a substrate in a process chamber, comprising;

(a) exposing said substrate to substantially continuous flow of a process gas composition at a constant flow rate under process conditions for a first period of time;

(b) after the first period of time, pulsing a precursor into the chamber, wherein the substantially continuous flow of the process gas composition at the constant flow rate is maintained during the pulsing, wherein said precursor does not react with said process gas under said process conditions, and wherein said pulsing a precursor into the chamber comprises more than one injection of a precursor; then (c) continuing the substantially continuous flow of the process as composition at the constant flow rate for second period of time;

(d) after the second period of time, pulsing high frequency power in the chamber to produce plasma conditions, wherein the substantially continuous flow of the process gas composition at the constant flow rate is maintained during the pulsing high frequency power, and wherein under said plasma conditions said precursor reacts with said process gas; and (e) repeating (a), (b), (c), and (d) until a desired thickness of said film layer has been achieved.

26. A method for forming a film layer on a substrate in a process chamber, comprising:

(a) exposing said substrate to a substantially continuous flow of a process gas composition at a constant flow rate under process conditions for a first period of time;

(b) after the first period of time, pulsing a precursor into the chamber, wherein the substantially continuous flow of the process gas composition at the constant flow rate is maintained during the pulsing, and wherein said precursor does not react with said process gas under said process conditions; then (c) continuing the substantially continuous flow of the process gas composition at the constant flow rate for second period of time;

(d) after the second period of time, pulsing high frequency power in the chamber to produce plasma conditions, wherein the substantially continuous flow of the process gas composition at the constant flow rate is maintained during the pulsing high frequency power, wherein under said plasma conditions said precursor reacts with said process gas, and wherein said pulsing high frequency power comprises more than one pulse of a high frequency power; and (e) repeating (a), (b), (c), and (d) until a desired thickness of said film layer has been achieved.

27. A method for forming a film on a substrate in a process chamber using a cyclical deposition process using a precursor, comprising:

(a) exposing said substrate to a substantially continuous flow of a combination of $H_2$ and $O_2$ at a rate of about 500–2000 sccm for a first period of time of about 0.5 seconds to about 1 second;

(b) after the first period of time, pulsing $SiCl_4$ into the chamber at a rate of about 200 to about 500 sccm for about 0.5 seconds to about 1 second, wherein the substantially continuous flow of the combination of $H_2$ and $O_2$ is maintained during the pulsing; then (c) continuing the substantially continuous flow of the combination of $H_2$ and $O_2$ for a second period of about 1 second to about 4 seconds;

(d) after the second period of time, pulsing RF power at about 500 W to about 2000 W for about 2 seconds to about 6 seconds, wherein the substantially continuous flow of the combination of $H_2$ and $O_2$ is maintained during the pulsing RF power; and (e) repeating (a), (b), (c), and (d) until a desired thickness of said film layer has been achieved.

28. A method for forming a film layer on a substrate in a process chamber, comprising:

(a) exposing the substrate to a continuous flow of a first gas composition at a constant flow rate for a first period of time;

(b) exposing the substrate to a second gas composition and the continuous flow of a first gas at the constant flow rate for a second period of time, wherein the second gas composition is a silicon-containing precursor;

(c) exposing the substrate to the continuous flow of a first gas composition at the constant flow rate for a third period of time;

(d) electrically coupling high frequency power into the process chamber during a fourth period of time, thereby exciting the first gas composition into a plasma state, wherein the second gas composition reacts with the first gas composition to form a film layer on the substrate, and wherein the continuous flow of a first gas composition at the constant flow rate is maintained during the fourth period of time; and (e) repeating (a), (b), (c), and (d) until a desired thickness of said film layer has been achieved.

29. The method of claim 28, wherein the silicon-containing precursor is a halogenated silicon compound.

30. The method of claim 28, wherein the exposing the substrate to a second gas composition comprises providing a pulse of the second gas composition.

31. The method of claim 28, wherein the first period of time is about 0.2 seconds to about 5 seconds, and the third period of time is about 0.2 seconds to about 5 seconds.

32. The method of claim 28, wherein the exposing the substrate to the continuous flow of a first process gas composition for a third period of time removes excess second gas composition from the process chamber.

33. A method for forming a film layer on a substrate in a process chamber, comprising:

(a) exposing the substrate to a continuous flow of a first gas composition at a constant flow rate for a first period of time, wherein the first gas composition is a combination of $H_2$ and $O_2$ gases;

(b) exposing the substrate to a second gas composition and the continuous flow of a first gas at the constant flow rate for a second period of time;

(c) exposing the substrate to the continuous flow of a first gas composition at the constant flow rate for a third period of time;

(d) electrically coupling high frequency power into the process chamber during a fourth period of time, thereby exciting the first gas composition into a plasma state, wherein the second gas composition reacts with the first gas composition to form a film layer on the substrate, and wherein the continuous flow of a first gas composition at the constant flow rate is maintained during the fourth period of time; and (e) repeating (a), (b), (c), and (d) until a desired thickness of said film layer has been achieved.

* * * * *

UNITED STATES PATENT AND TRADEMARK OFFICE
CERTIFICATE OF CORRECTION

PATENT NO. : 6,825,134 B2
APPLICATION NO. : 10/254627
DATED : November 30, 2004
INVENTOR(S) : Kam S. Law et al.

It is certified that error appears in the above-identified patent and that said Letters Patent is hereby corrected as shown below:

Column 6, Line 64: Change "(Ti)" to --($T_1$)--

Column 7, Line 5: Change "(Ti)" to --($T_1$)--

Column 7, Line 6: Change "(Ti)" to --($T_1$)--

Column 9, Line 15: Change "6O8b" to --608b--

Column 12, Claim 7, Line 36: Change "whereinsaid" to --wherein said--

Column 12, Claim 14, Line 54: Change "scorn" to --sccm--

Column 14, Claim 25, Line 50: After "process", change "as" to --gas--

Signed and Sealed this

Twenty-second Day of August, 2006

JON W. DUDAS
*Director of the United States Patent and Trademark Office*